US009347608B2

(12) United States Patent
Mao

(10) Patent No.: US 9,347,608 B2
(45) Date of Patent: May 24, 2016

(54) SUPPORTING MECHANISM AND RELATED ELECTRONIC DEVICE CAPABLE OF APPLYING TO ROTATION OF A SIGNAL TRANSMISSION HOLDER

(71) Applicant: Wistron Corporation, New Taipei (TW)

(72) Inventor: Zhong-hui Mao, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 0 days.

(21) Appl. No.: 14/631,854

(22) Filed: Feb. 26, 2015

(65) Prior Publication Data

US 2016/0057884 A1    Feb. 25, 2016

(30) Foreign Application Priority Data

Aug. 25, 2014 (CN) .......................... 2014 1 0422021

(51) Int. Cl.
*H05K 7/14* (2006.01)
*F16M 13/02* (2006.01)
*H05K 5/02* (2006.01)

(52) U.S. Cl.
CPC ........... *F16M 13/022* (2013.01); *H05K 5/0226* (2013.01); *H05K 7/1487* (2013.01)

(58) Field of Classification Search
CPC . F16M 13/022; H05K 7/1487; H05K 5/0226; H05K 5/0269; H05K 13/0069; G06F 1/184; G06F 1/185; G06F 1/186
USPC ............ 361/724–727, 753, 759, 730, 679.33; 248/248.1
See application file for complete search history.

(56) References Cited

U.S. PATENT DOCUMENTS

| | | | | |
|---|---|---|---|---|
| 4,448,382 A * | 5/1984 | Melone | ..................... | A47C 3/30 248/281.11 |
| 6,986,675 B2 * | 1/2006 | Takada | ................. | G11B 33/121 439/159 |
| 7,813,125 B2 * | 10/2010 | Huang | .................. | E05B 15/024 361/679.55 |
| 2007/0019379 A1 * | 1/2007 | Hsiao | ...................... | G06F 1/187 361/679.02 |
| 2011/0289521 A1 * | 11/2011 | Chen | .................... | G11B 33/124 720/601 |
| 2012/0223199 A1 * | 9/2012 | Abri | ...................... | A61B 19/26 248/280.11 |
| 2012/0307441 A1 * | 12/2012 | Hung | .................... | G06F 1/1632 361/679.09 |
| 2013/0163899 A1 * | 6/2013 | Chen | .................... | G06F 1/1624 384/8 |
| 2013/0258620 A1 | 10/2013 | Qiu | | |
| 2013/0308268 A1 * | 11/2013 | Tani | ...................... | G06F 1/1681 361/679.57 |
| 2014/0048674 A1 * | 2/2014 | Hu | ........................ | F16M 13/00 248/558 |
| 2014/0376168 A1 * | 12/2014 | Yang | ..................... | G06F 1/1681 361/679.27 |
| 2015/0062793 A1 * | 3/2015 | Chen | .................... | G06F 1/1681 361/679.12 |

\* cited by examiner

*Primary Examiner* — Jinhee Lee
*Assistant Examiner* — Abhishek Rathod
(74) *Attorney, Agent, or Firm* — Winston Hsu; Scott Margo

(57) ABSTRACT

A supporting mechanism and a related electronic device can be adapted to apply to rotation of a signal transmission holder. The rotary supporting mechanism includes a base, a bracket, a first connecting rod, a second connecting rod, a third connecting rod and a actuating component. The signal transmission holder is disposed on the bracket . Two end of the first connecting rod respectively pivot between the base and the bracket. A first end of the second connecting rod pivots to the bracket . Two ends of the third connecting rod respectively pivot to the base and a second end of the second connecting rod. The actuating component is rotatably disposed on the second connecting rod. A contacting portion of the actuating component is movably shifted between a first blocker and a second blocker of the third connecting rod since the second connecting rod rotates relative to the third connecting rod.

12 Claims, 11 Drawing Sheets

SUPPORTING MECHANISM AND RELATED ELECTRONIC DEVICE CAPABLE OF APPLYING TO ROTATION OF A SIGNAL TRANSMISSION HOLDER

BACKGROUND OF THE DISCLOSURE

1. Field of the Disclosure

The present disclosure relates to a supporting mechanism with a signal transmission holder and a related electronic device, and more particularly, to a supporting mechanism and a related electronic device capable of applying to rotation of a signal transmission holder by the four-bar linkage module.

2. Description of the Prior Art

A plurality of hard disk apparatuses (such as the storage module) is disposed inside the server as an array to increase information storage efficiency. In order to economize inner space of the server, to maintain preferred heat dissipating efficiency, and to conveniently assemble and/or disassemble the hard disk apparatus, the conventional server disposes a signal transmission holder inside the housing to electrically connect with lots of hard disk apparatuses simultaneously, instead of utilization of several transmission cables individually connected to the corresponding hard disk apparatus, so that the conventional server can economize amounts of the transmission cable, and has properties of low cost and easy assembly. However, the conventional server normally fixes the signal transmission holder on the bracket inside the housing by screws or bolts, or hangs the signal transmission holder on the bracket and then uses a blocker to press the signal transmission holder to avoid the signal transmission holder and the bracket from separation. The conventional fixing mechanism applied to the signal transmission holder as mentioned above has complicated operating procedure, and is unsuitable for the server with plenty of the hard disk apparatuses

SUMMARY OF THE DISCLOSURE

The present disclosure provides a supporting mechanism and a related electronic device capable of applying to rotation of a signal transmission holder by the four-bar linkage module for solving above drawbacks.

According to the claimed disclosure, a supporting mechanism capable of applying to rotation of a signal transmission holder is disclosed. The supporting mechanism includes a base, a bracket, a first connecting rod, a second connecting rod, a third connecting rod and an actuating component. The base includes a jointing portion. The signal transmission holder is disposed on the bracket . A lateral wall stretches from a side of the bracket. Two ends of the first connecting rod respectively pivot to the jointing portion and the lateral wall of the bracket. A first end of the second connecting rod pivots to the lateral wall of the bracket . The third connecting rod includes a first blocking portion and a second blocking portion. Two ends of the third connecting rod respectively pivot to the jointing portion and a second end of the second connecting rod. The actuating component is rotatably disposed on the second connecting rod. The second connecting rod is adapted to rotate relative to the third connecting rod to movably shift a contacting portion of the actuating component between the first blocking portion and the second blocking portion, so as to set position of the bracket relative to the base.

According to the claimed disclosure, the base further includes at least one constraining portion. A movement of the bracket is constrained by the constraining portion since the contacting portion leans against the first blocking portion.

According to the claimed disclosure, the bracket is separated from the constraining portion since the contacting portion leans against the second blocking portion.

According to the claimed disclosure, the second connecting rod includes a first restraining portion, and the second connecting rod further includes a second restraining portion. The first restraining portion leans against the second restraining portion to restrain relative rotation between the second connecting rod and the third connecting rod.

According to the claimed disclosure, the supporting mechanism further includes a recovering component disposed between the second connecting rod and the actuating component. A resilient recovering force of the recovering component drives the actuating component to slidably drift over the second connecting rod.

According to the claimed disclosure, the recovering component is a tension spring.

According to the claimed disclosure, an electronic device includes a holding frame, a signal transmission holder and a supporting mechanism. At least one storage module is detachably disposed on the holding frame. The supporting mechanism is capable of switching relative rotation between the holding frame and the signal transmission holder. The supporting mechanism includes a base, a bracket, a first connecting rod, a second connecting rod, a third connecting rod and an actuating component. The base includes a jointing portion. The signal transmission holder is disposed on the bracket. A lateral wall stretches from a side of the bracket. Two ends of the first connecting rod respectively pivot to the jointing portion and the lateral wall of the bracket. A first end of the second connecting rod pivots to the lateral wall of the bracket. The third connecting rod includes a first blocking portion and a second blocking portion. Two ends of the third connecting rod respectively pivot to the jointing portion and a second end of the second connecting rod. The actuating component is rotatably disposed on the second connecting rod. The second connecting rod is adapted to rotate relative to the third connecting rod to movably shift a contacting portion of the actuating component between the first blocking portion and the second blocking portion, so as to set position of the bracket relative to the base.

The supporting mechanism of the present disclosure utilizes the first connecting rod, the second connecting rod, the third connecting rod and the lateral wall of the bracket to construct the four-bar linkage module. The signal transmission holder can be switched between the closed mode and the open mode by linkage function of the supporting mechanism, so the signal transmission holder can be conveniently assembled with and disassembled from the bracket. Comparing to the prior art, the supporting mechanism of the present disclosure can switch the signal transmission holder to the recumbent position for the open mode, so the user has sufficient working space to assemble and disassemble the signal transmission holder from the bracket. The signal transmission holder further can be switched to the upright position for the closed mode, to rapidly establish connection channel between the signal transmission holder and the storage modules inside the holding frame.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
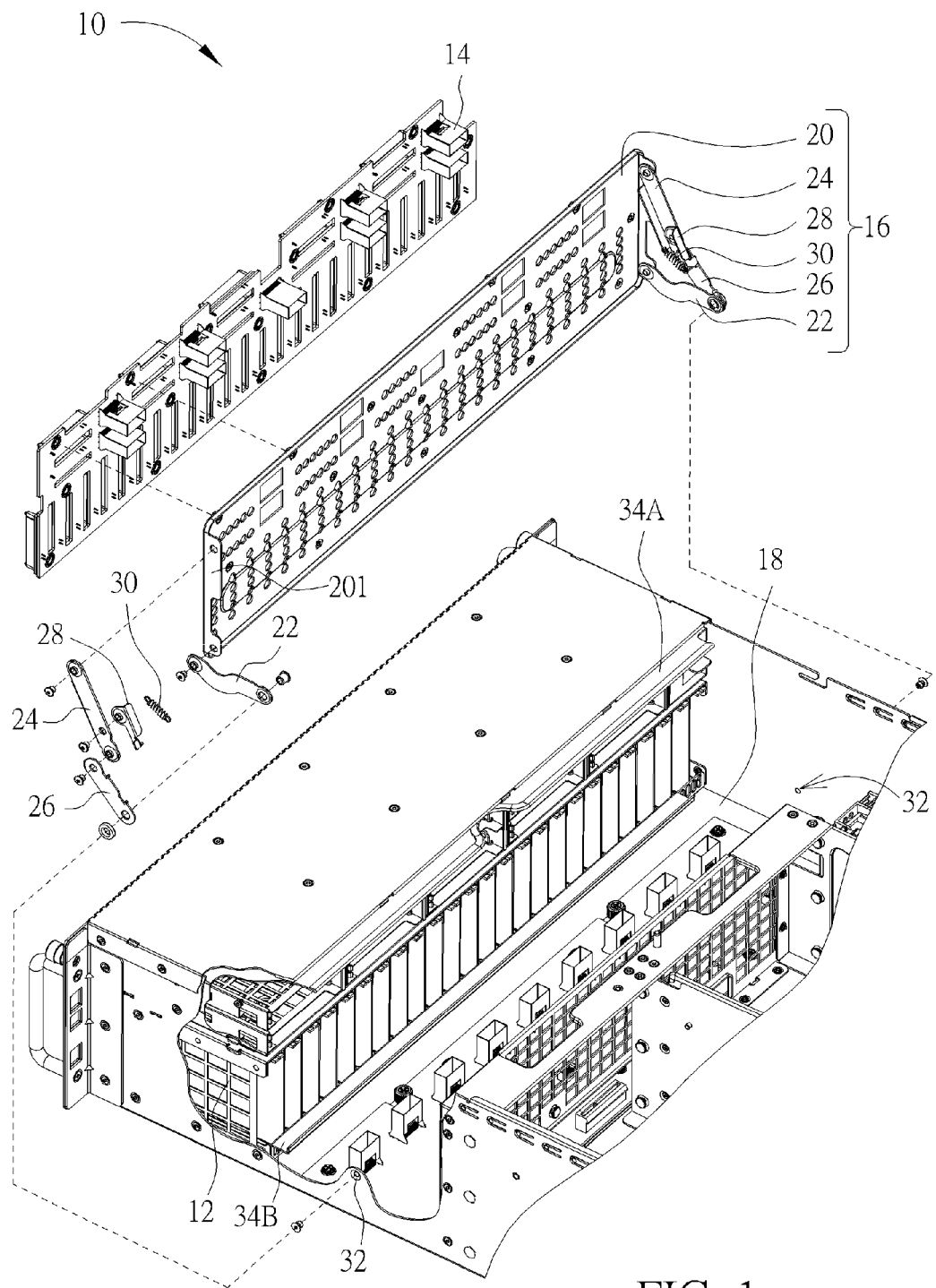
FIG. 1 is an exploded diagram of an electronic device according to an embodiment of the present disclosure.

Please refer to FIG. 1. FIG. 1 is an exploded diagram of an electronic device 10 according to an embodiment of the present disclosure. The electronic device 10 includes a holding frame 12, a signal transmission holder 14 and a supporting mechanism 16. The electronic device 10 can be a server system. One or more storage modules (which can be the hard disk apparatus and not shown in figures) are detachably disposed on the holding frame 12. An amount of the storage module depends on performance of the server system. The signal transmission holder 14 is a circuit board that has a plurality of connectors. When the holding frame 12 supports a plurality of storage modules, the signal transmission holder 14 can be assembled with the holding frame 12 to electrically connect to the plurality of storage modules on the holding frame 12 simultaneously. The supporting mechanism 16, being a four-link assembly, can be utilized to switch the signal transmission holder 14 to an upright position to stand by a side of the holding frame 12, or to switch the signal transmission holder 14 to a recumbent position for separating from the holding frame 12.

The supporting mechanism 16 includes a base 18, a bracket 20, a first connecting rod 22, a second connecting rod 24, a third connecting rod 26, an actuating component 28 and a recovering component 30. The first connecting rod 22, the second connecting rod 24, the third connecting rod 26, and a lateral wall 201 of the bracket 20 are assembled to construct a four-bar linkage module. The actuating component 28 is manually driven to contact against the third connecting rod 26 or to be separated from the third connecting rod 26, and the four-bar linkage module can drive the bracket 20 whereon the signal transmission holder 14 is disposed to switch between the upright position and the recumbent position. The supporting mechanism 16 may include two four-bar linkage modules respectively disposed on opposite sides of the bracket 20 to share weight of the signal transmission holder 14, or includes single four-bar linkage module disposed on one side or a middle location of the bracket 20. Following illustration focuses on the embodiment with two four-bar linkage modules; however, amounts and location of the four-bar linkage module are not limited to the above-mentioned embodiment, which depend on design demand.

Figure 2:
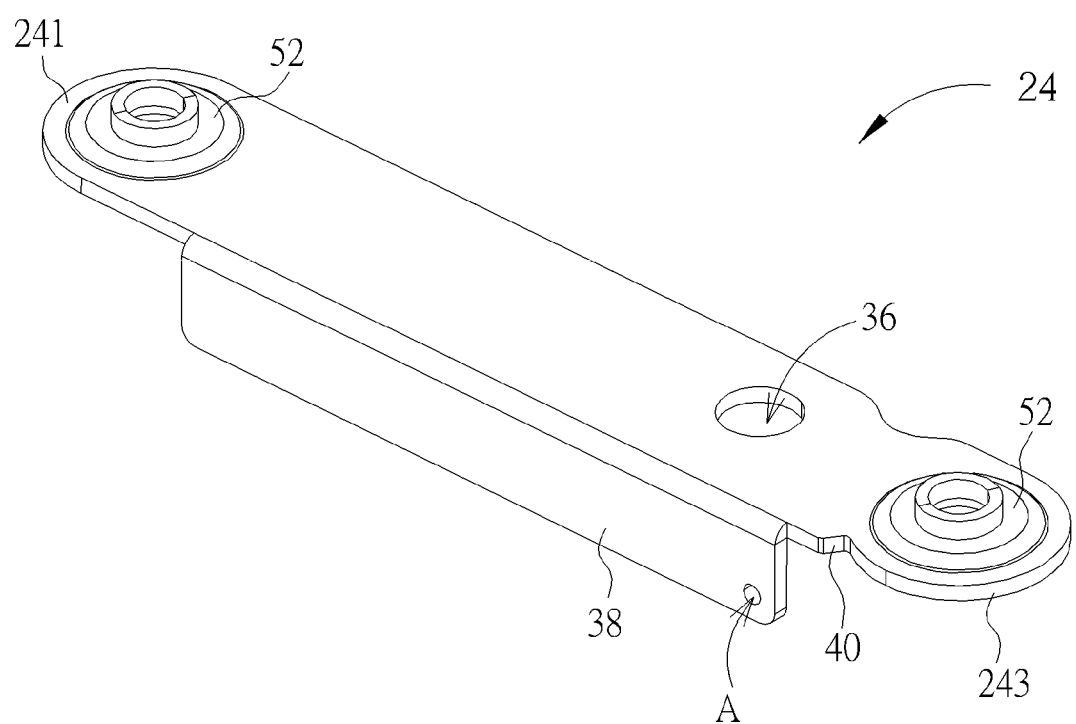
FIG. 2 is a diagram of a second connecting rod according to the embodiment of the present disclosure.
Figure 3:
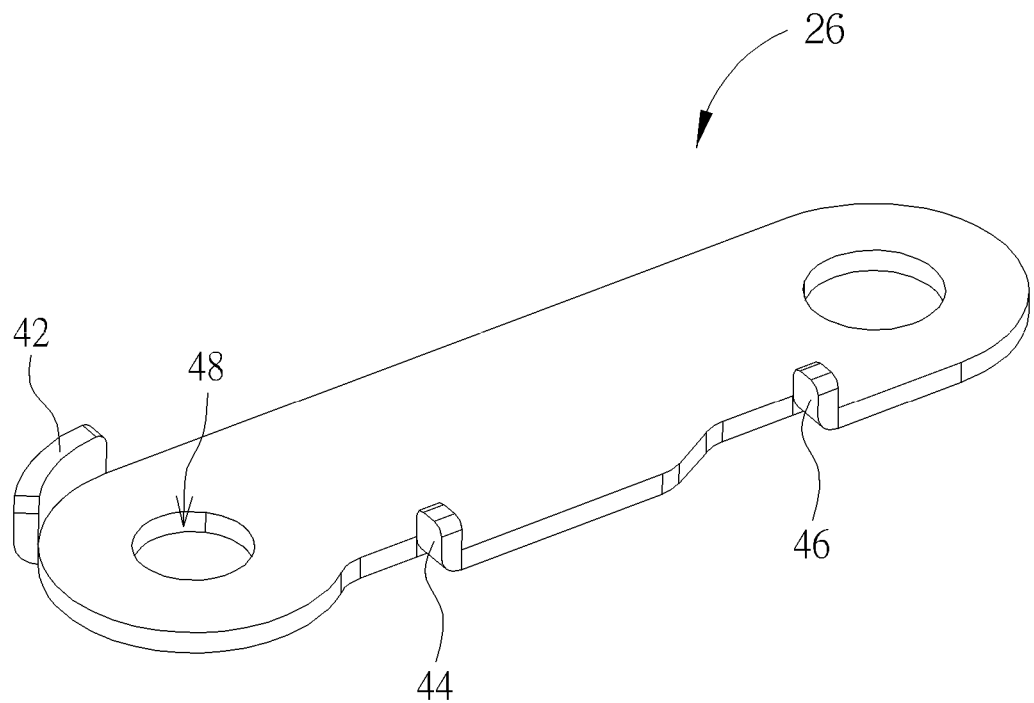
FIG. 3 is a diagram of a third connecting rod according to the embodiment of the present disclosure.
Figure 4:
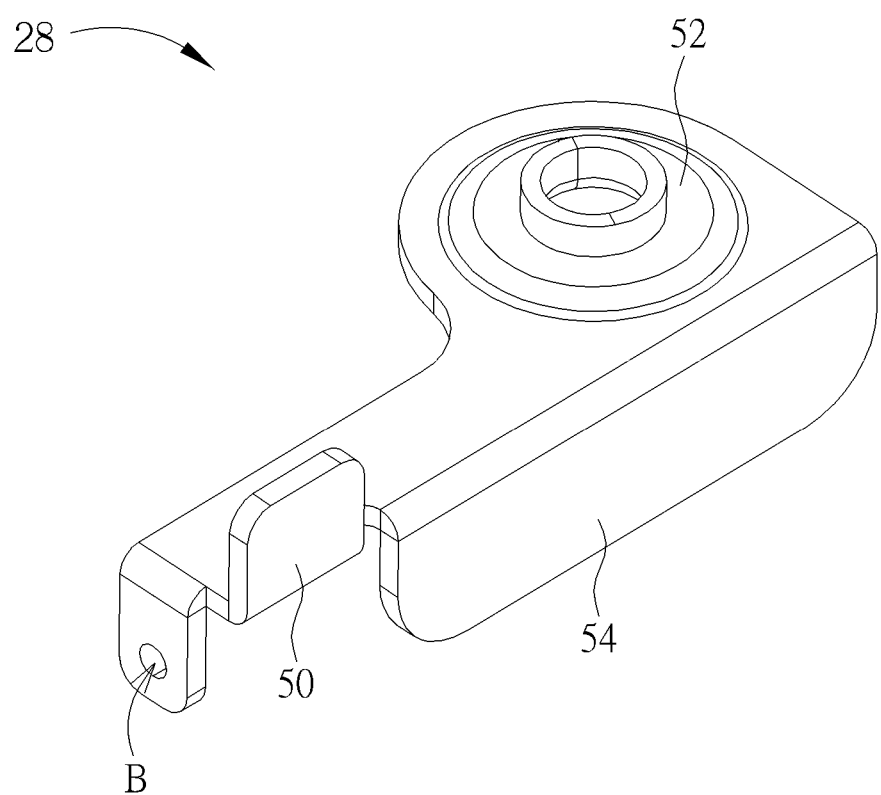
FIG. 4 is a diagram of an actuating component according to the embodiment of the present disclosure.

Please refer to FIG. 1 to FIG. 4. FIG. 2 is a diagram of the second connecting rod 24 according to the embodiment of the present disclosure. FIG. 3 is a diagram of the third connecting rod 26 according to the embodiment of the present disclosure. FIG. 4 is a diagram of the actuating component 28 according to the embodiment of the present disclosure. The base 18 can be a bottom housing of the electronic device 10. The base 18 includes several jointing portions 32. An amount of the jointing portion 32 is designed according to amounts of the four-bar linkage module. The jointing portion 32 can be a protrusion or a sunken slot formed on the base 18. The bracket 20 is adapted to support the signal transmission holder 14. The bracket 20 can be rotatably switched relative to the base 18 (or the holding frame 12) between the upright position and the recumbent position, so as to conveniently assemble and disassemble the signal transmission holder 14 from the storage modules of the holding frame 12. In addition, the base 18 further can include one or more constraining portions 34A, 34B to constrain a movement of the bracket 20. For example, the upper constraining portion 34A can be adapted to downwardly press the bracket 20, the lower constraining portion 34B can be utilized to upwardly hold the bracket 20 and to contact against a side of the bracket 20, and the bracket 20 can be stably set on the upright position.

The first connecting rod 22 is preferably made of high strength rigid material. Two ends of the first connecting rod 22 respectively pivot to the jointing portion 32 and a bottom of the bracket 20. A first end 241 of the second connecting rod 24 pivots to a top of the bracket 20, and the other end 243 of the second connecting rod 24 pivots to the third connecting rod 26. The actuating component 28 is rotatably disposed on an axial hole 36 on the second connecting rod 24. A folded plate portion 38 can be formed on a lateral side of the second connecting rod 24 to increase structural strength of the second connecting rod 24. The second connecting rod 24 includes a first restraining portion 40 disposed on a position adjacent to the second end 243. Two ends of the third connecting rod 26 respectively pivot to the jointing portion 32 and the second end 243 of the second connecting rod 24. The third connecting rod 26 includes a second restraining portion 42, a first blocking portion 44 and a second blocking portion 46. The second end 243 is rotatably connected to a pivot hole 48 formed on a position adjacent by the second restraining portion 42. The second restraining portion 42 is utilized to block the first restraining portion 40, so as to restrain a rotating range between the second connecting rod 24 and the third connecting rod 26.

Generally, the first restraining portion 40 can be a sunken structure formed on a main body of the second connecting rod 24. The second restraining portion 42, the first blocking portion 44 and the second blocking portion 46 can be folded structures disposed on different positions on a main body of the third connecting rod 26. Further, elements of the supporting mechanism 16, such as the base 18, the bracket 20, the first connecting rod 22, the second connecting rod 24, the third connecting rod 26 and/or the actuating component 28, can have a protruding platen 52 formed on the own pivot position. The rotary shaft or the axial hole is preferably disposed on the protruding platen 52 to decrease contact area since the elements rotate, so as to decrease friction resistance and to increase operational fluency of the supporting mechanism 16.

An end of the actuating component 28 pivots to the axial hole 36 on the second connecting rod 24, and a contacting portion 50 is disposed on the other end of the actuating component 28. The actuating component 28 further includes a handle 54 which can be manually applied to rotate the bracket 20. Resilient recovering force of the recovering component 30 drives the contacting portion 50 of the actuating component 28 to slidably drift over the second connecting rod 24. The recovering component 30 can be a tension spring. Two ends of the recovering component 30 are respectively disposed on a juncture A of the second connecting rod 24 and a juncture B of the actuating component 28. When the contacting portion 50 leans against the first blocking portion 44 or the second blocking portion 46, the actuating component 28 does not rotate relative to the second connecting rod 24. When the contacting portion 50 is separated from the first blocking portion 44 (or the second blocking portion 46), the actuating component 28 can freely rotate relative to the second connecting rod 24 so as to drive the second connecting rod 24 to rotate relative to the third connecting rod 26, the first connecting rod 22 can be rotated accordingly, and the bracket 20 can be switched between the recumbent position and the upright position. Since the contacting portion 50 leans against the first blocking portion 44 (or the second blocking portion 46), the bracket 20 stops its rotation and can be stably set on the upright position (or the recumbent position). It should be mentioned that the embodiment not only uses the tension spring to be the recovering component 30 for providing the resilient recovering force, but also can use any other resilient unit (such as the torsional spring) for replacement. Any resilient unit capable of pressing the actuating component 28 on the second connecting rod 24 belongs to scope of the recovering component 30 in the present disclosure.

Figure 5:
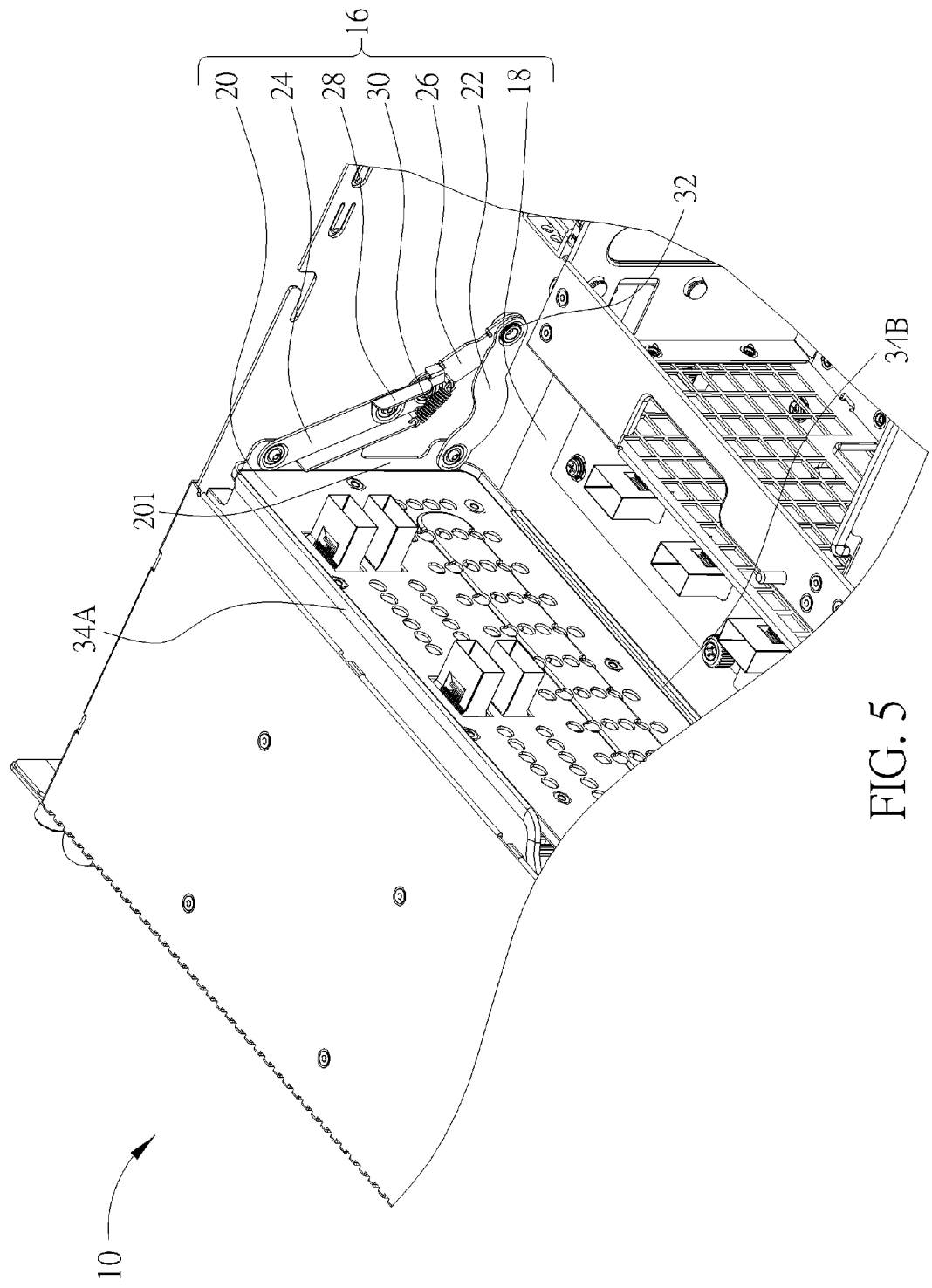
FIG. 5 to FIG. 7 are diagrams of a supporting mechanism in different operational modes according to the embodiment of the present disclosure.
Figure 6:
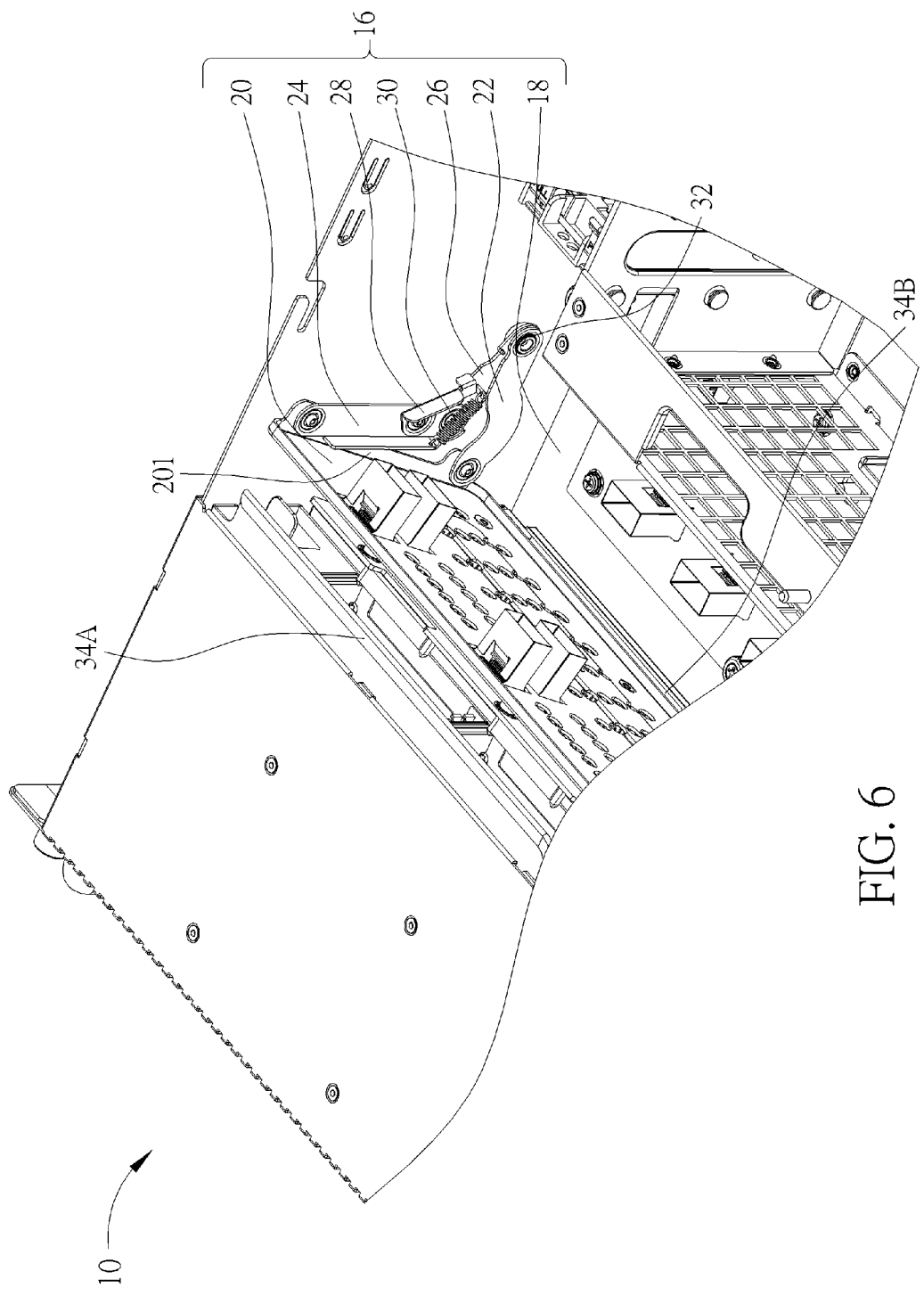
Figure 7:
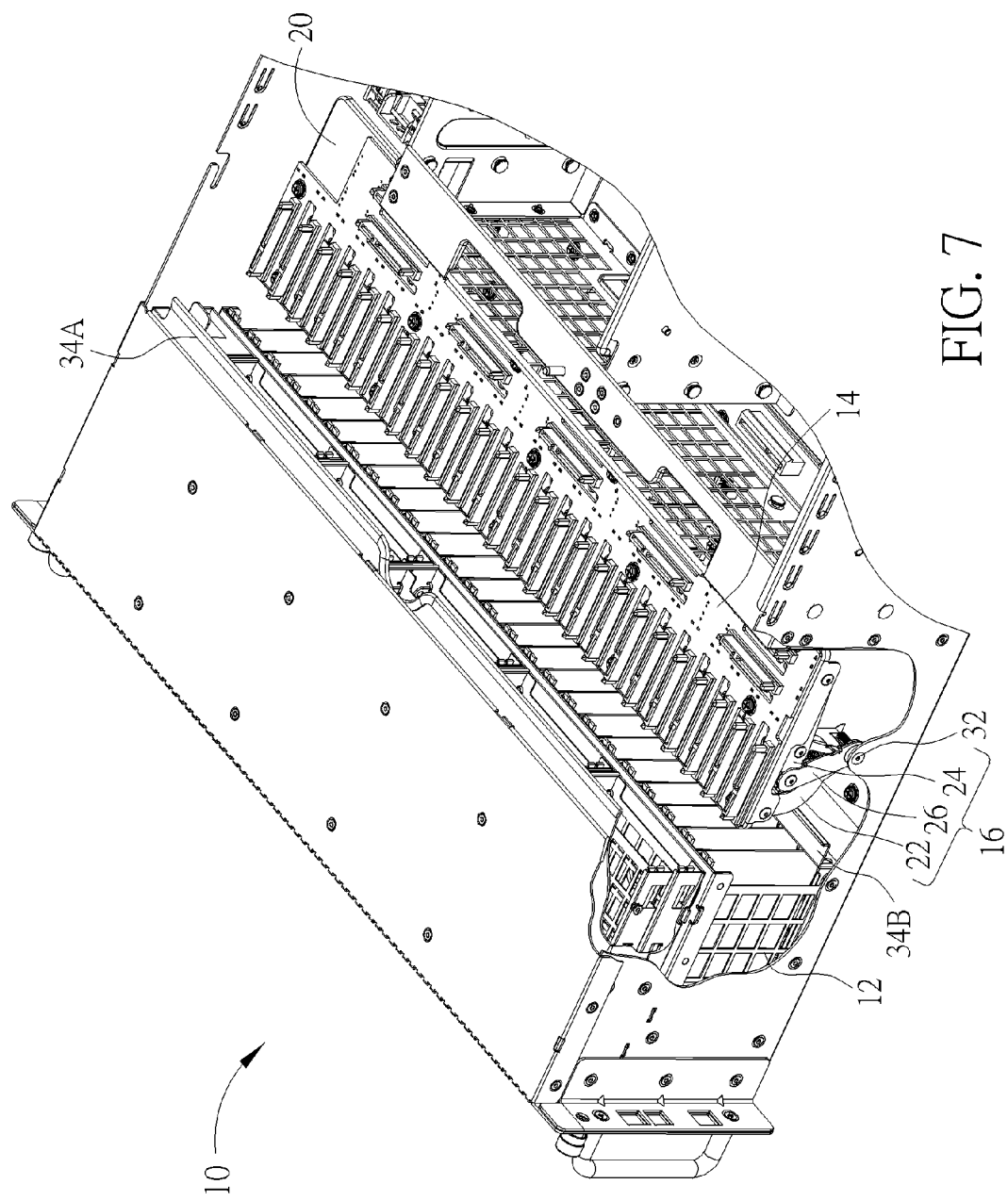
Figure 8:
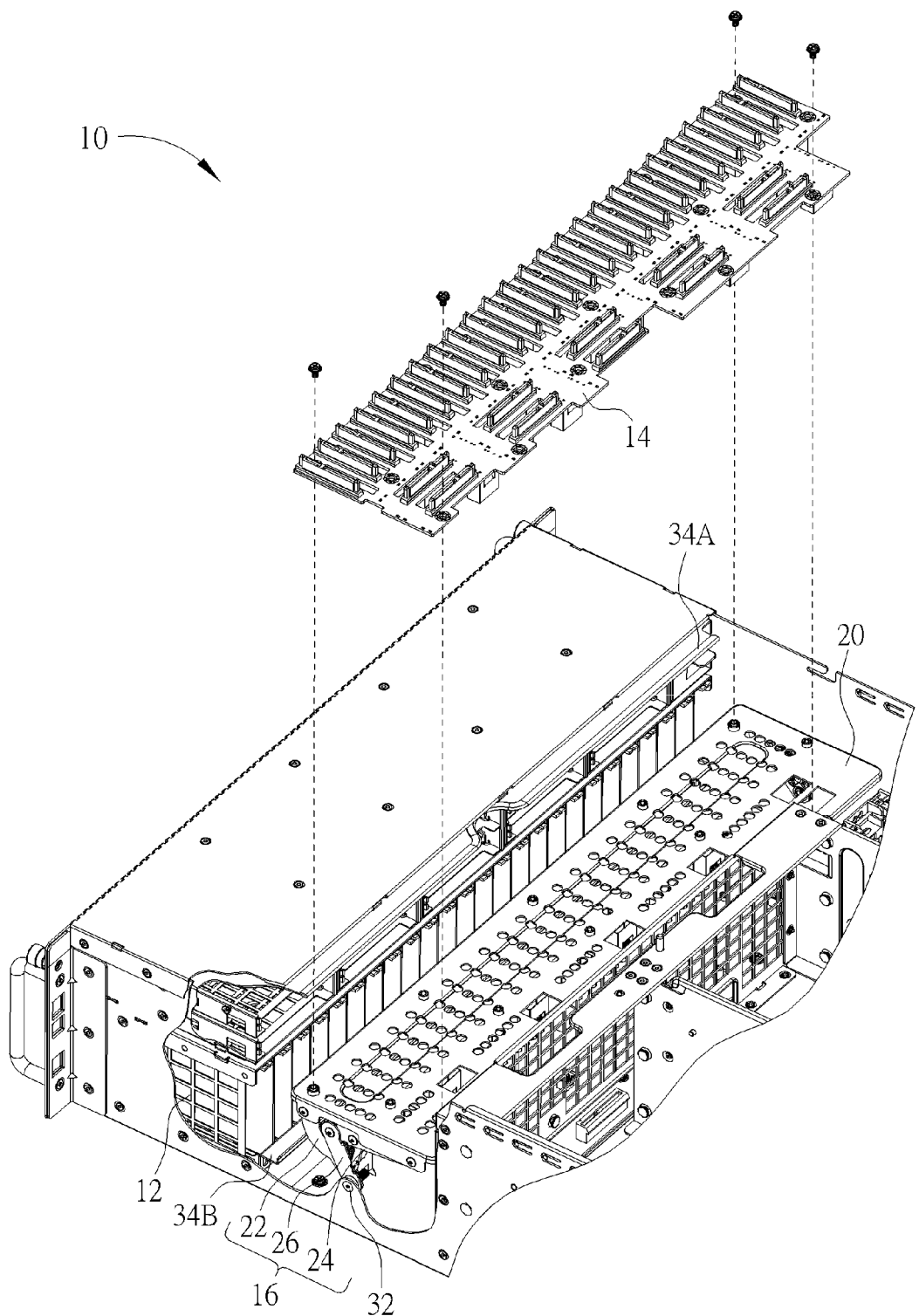
FIG. 8 is a diagram of a signal transmission holder disassembled from a bracket according to the embodiment of the present disclosure.
Figure 9:
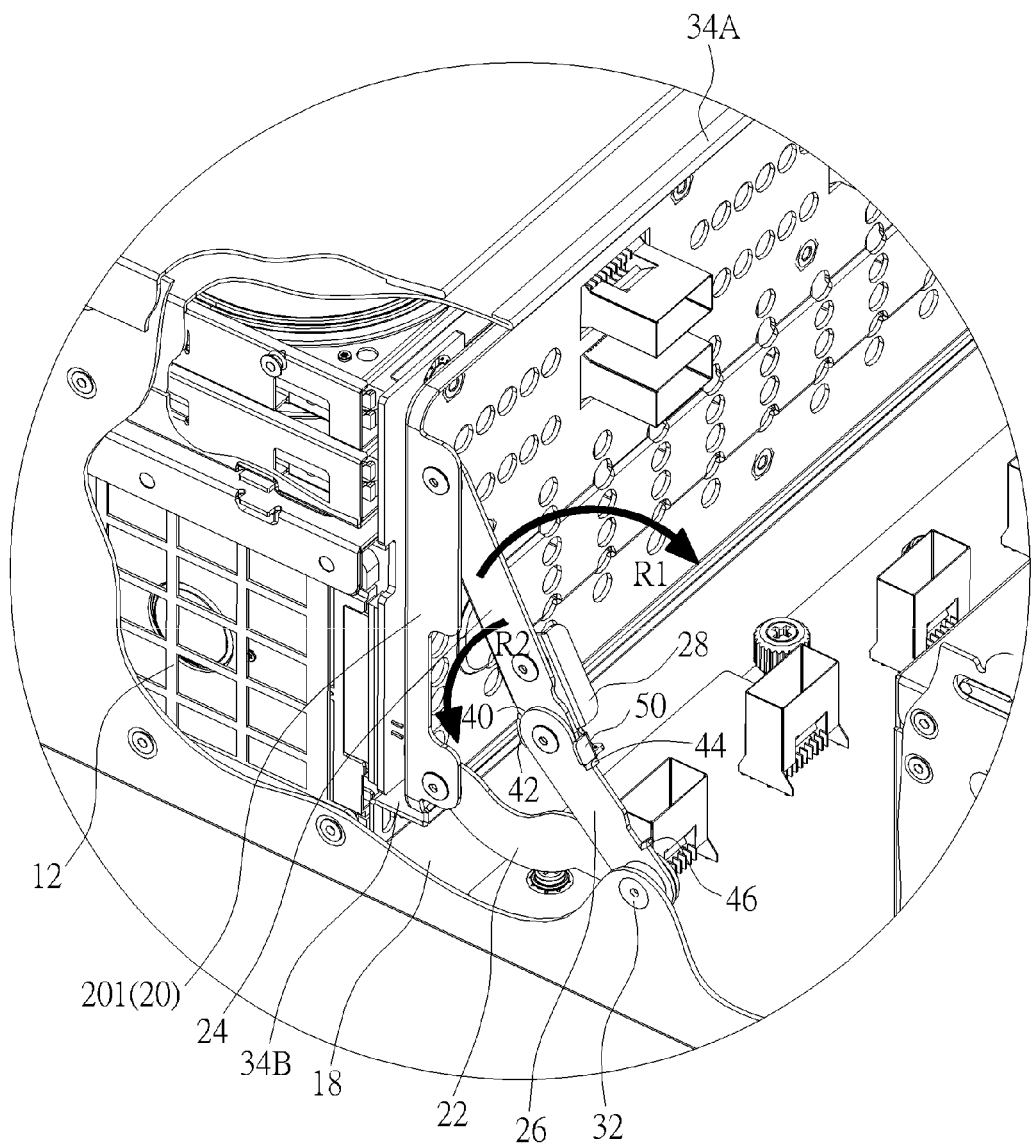
FIG. 9 to FIG. 11 are enlarged diagrams of the supporting mechanism shown in FIG. 5 to FIG. 7.
Figure 10:
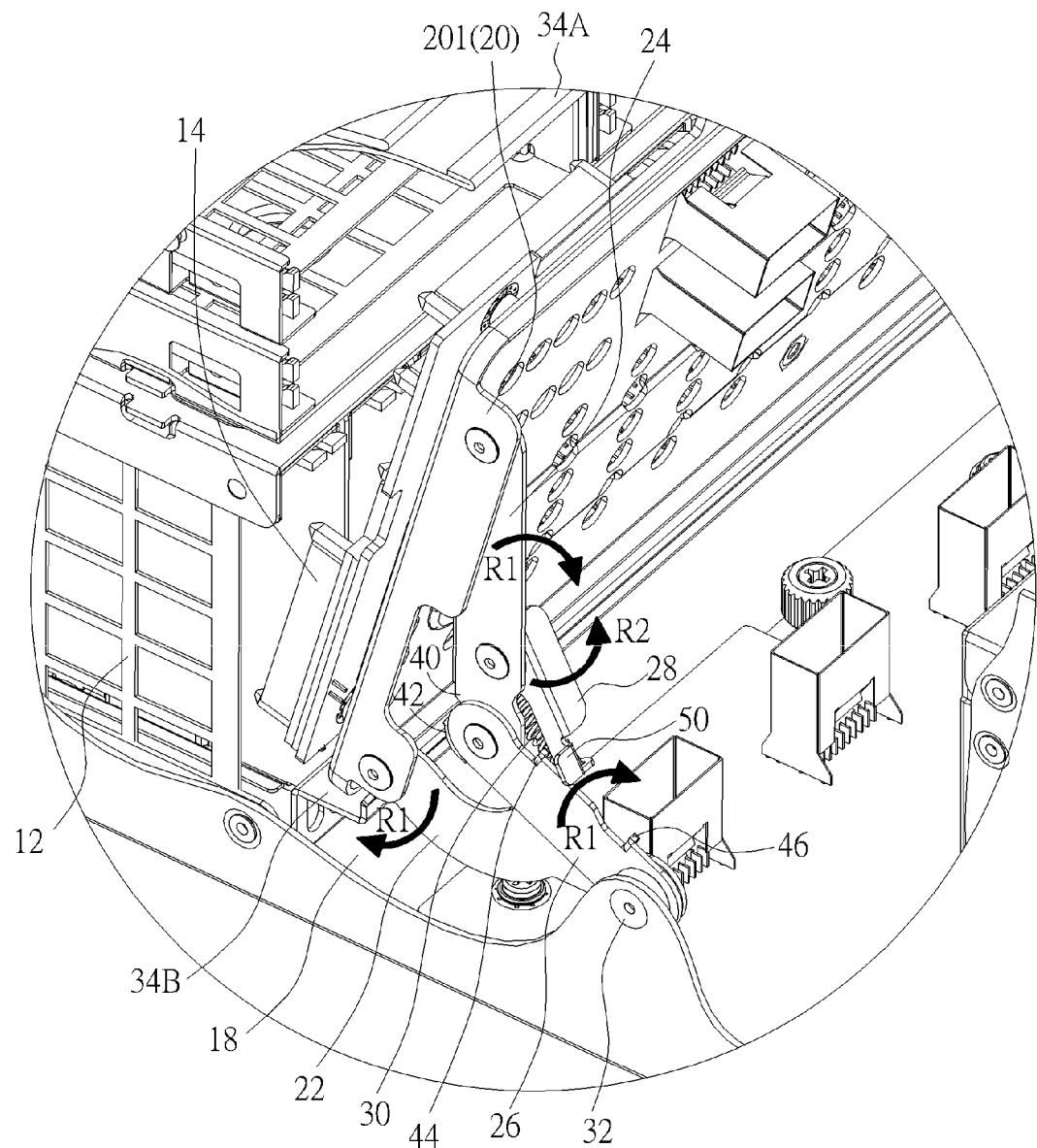
Figure 11:
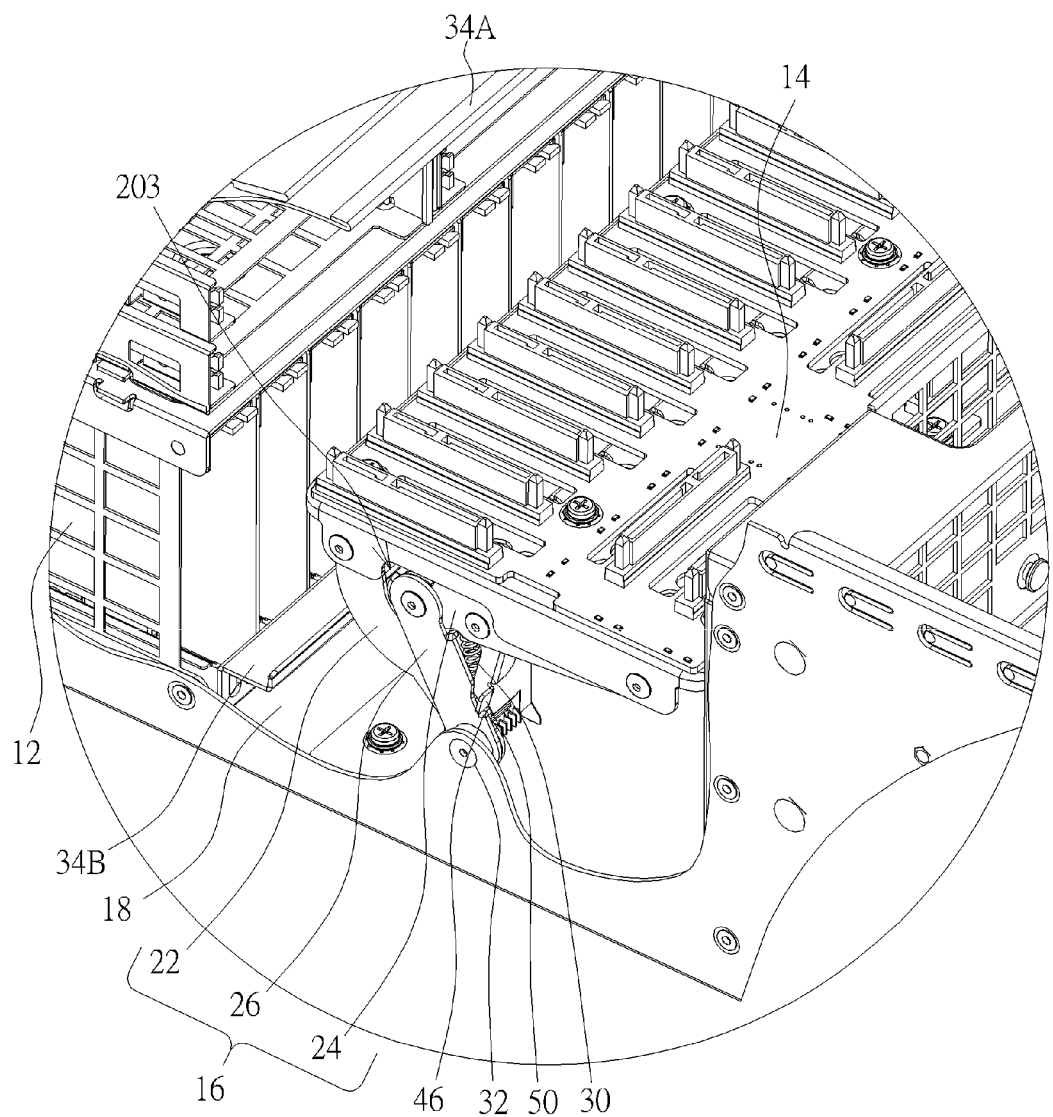

Please refer to FIG. 5 to FIG. 11. FIG. 5 to FIG. 7 are diagrams of the supporting mechanism 16 in different operational modes according to the embodiment of the present disclosure. FIG. 8 is a diagram of the signal transmission holder 14 disassembled from the bracket 20 according to the embodiment of the present disclosure. FIG. 9 to FIG. 11 are enlarged diagrams of the supporting mechanism 16 shown in FIG. 5 to FIG. 7. As shown in FIG. 5, the supporting mechanism 16 is switched to a closed mode, the bracket 20 is switched to the upright position relative to the base 18, and the signal transmission holder 14 is disposed by the holding frame 12 to electrically connect with the storage modules on the holding frame 12. As shown in FIG. 6 and FIG. 7, the bracket 20 can be inclined from the upright position (which means the position substantially perpendicular to the base 18) when the actuating component 28 is upwardly rotated, and rotation of the bracket 20 is stopped until the bracket 20 is switched to the recumbent position (which means the position substantially parallel to the base 18); in the meantime, the supporting mechanism 16 is switched to an open mode and the signal transmission holder 14 can be easily assembled and disassembled. As shown in FIG. 8, the signal transmission holder 14 can be assembled with or disassembled from the bracket 20 by a screw/bolt locking manner or any other engagement manner.

As shown in FIG. 9, the contacting portion 50 of the actuating component 28 leans against the first blocking portion 44 of the third connecting rod 26, to constrain rotation of the second connecting rod 24 relative to the third connecting rod 26 at a clockwise direction R1. The first restraining portion 40 of the second connecting rod 24 further contacts the second restraining portion 42 of the third connecting rod 26 to restrain rotation of the second connecting rod 24 relative to the third connecting rod 26 at a counterclockwise direction R2, so as to keep the supporting mechanism 16 at the closed mode (which equals the upright position); meanwhile, sides of the bracket 20 are buckled by the constraining portions 34A, 34B. As shown in FIG. 10, the actuating component 28 is manually driven to rotate at the counterclockwise direction R2, and the contacting portion 50 is separated from the first blocking portion 44 to rotate the second connecting rod 24 at the clockwise direction R1. The recovering component 30 drives contacting portion 50 to shift from the first blocking portion 44 to the second blocking portion 46, so as to rotate the first connecting rod 22 and the third connecting rod 26 at the clockwise direction R1. That is, the bracket 20 can be switched from the closed mode (which equals the upright position) to the open mode (which equals the recumbent position), so the bracket 20 is separated from the constraining portions 34A, 34B. The bracket 20 can be set on the open mode since the contacting portion 50 leans against the second blocking portion 46. As shown in FIG. 11, the bracket 20 is switched to the recumbent position, the third connecting rod 26 shores a positioning hole 203 formed on the bracket 20, the bracket 20 does not rotate relative to the first connecting rod 22 and the second connecting rod 24, and the bracket 20 can be stably set on the recumbent position.

The supporting mechanism of the present disclosure utilizes the first connecting rod, the second connecting rod, the third connecting rod and the lateral wall of the bracket to construct the four-bar linkage module. The signal transmission holder can be switched between the closed mode and the open mode by linkage function of the supporting mechanism, so the signal transmission holder can be conveniently assembled with and disassembled from the bracket. Comparing to the prior art, the supporting mechanism of the present disclosure can switch the signal transmission holder to the recumbent position for the open mode, so the user has sufficient working space to assemble and disassemble the signal transmission holder from the bracket. The signal transmission holder further can be switched to the upright position for the closed mode, to rapidly establish connection channel between the signal transmission holder and the storage modules inside the holding frame.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A supporting mechanism capable of applying to rotation of a signal transmission holder by a four-link assembly, the supporting mechanism comprising:
   a base, the base comprising a jointing portion;
   a bracket whereon the signal transmission holder is disposed, a lateral wall stretching from a side of the bracket;
   a first connecting rod, two ends of the first connecting rod respectively pivoting to the jointing portion and the lateral wall of the bracket;
   a second connecting rod, a first end of the second connecting rod pivoting to the lateral wall of the bracket;
   a third connecting rod, the third connecting rod comprising a first blocking portion and a second blocking portion, two ends of the third connecting rod respectively pivoting to the jointing portion and a second end of the second connecting rod; and
   an actuating component rotatably disposed on the second connecting rod, the second connecting rod being adapted to rotate relative to the third connecting rod to movably shift a contacting portion of the actuating component between the first blocking portion and the second blocking portion, so as to set position of the bracket relative to the base.

2. The supporting mechanism of claim 1, wherein the base further comprises at least one constraining portion, a movement of the bracket is constrained by the constraining portion since the contacting portion leans against the first blocking portion.

3. The supporting mechanism of claim 2, wherein the bracket is separated from the constraining portion since the contacting portion leans against the second blocking portion.

4. The supporting mechanism of claim 1, wherein the second connecting rod comprises a first restraining portion, the second connecting rod further comprises a second restraining portion, the first restraining portion leans against the second restraining portion to restrain relative rotation between the second connecting rod and the third connecting rod.

5. The supporting mechanism of claim 1, further comprising:
a recovering component disposed between the second connecting rod and the actuating component, a resilient recovering force of the recovering component driving the actuating component to slidably drift over the second connecting rod.

6. The supporting mechanism of claim 5, wherein the recovering component is a tension spring.

7. An electronic device, comprising:
a holding frame whereon at least one storage module is detachably disposed;
a signal transmission holder; and
a supporting mechanism capable of switching relative rotation between the holding frame and the signal transmission holder by a four-link assembly, the supporting mechanism comprising:
a base, the base comprising a jointing portion;
a bracket whereon the signal transmission holder is disposed, a lateral wall stretching from a side of the bracket;
a first connecting rod, two ends of the first connecting rod respectively pivoting to the jointing portion and the lateral wall of the bracket;
a second connecting rod, a first end of the second connecting rod pivoting to the lateral wall of the bracket;
a third connecting rod, the third connecting rod comprising a first blocking portion and a second blocking portion, two ends of the third connecting rod respectively pivoting to the jointing portion and a second end of the second connecting rod; and
an actuating component rotatably disposed on the second connecting rod, the second connecting rod being adapted to rotate relative to the third connecting rod to movably shift a contacting portion of the actuating component between the first blocking portion and the second blocking portion, so as to set position of the bracket relative to the base.

8. The electronic device of claim 7, wherein the base further comprises at least one constraining portion, a movement of the bracket is constrained by the constraining portion since the contacting portion leans against the first blocking portion.

9. The electronic device of claim. 8, wherein the bracket is separated from the constraining portion since the contacting portion leans against the second blocking portion.

10. The electronic device of claim 7, wherein the second connecting rod comprises a first restraining portion, the second connecting rod further comprises a second restraining portion, the first restraining portion leans against the second restraining portion to restrain relative rotation between the second connecting rod and the third connecting rod.

11. The electronic device of claim 7, wherein the supporting mechanism further comprises a recovering component disposed between the second connecting rod and the actuating component, a resilient recovering force of the recovering component drives the actuating component to slidably drift over the second connecting rod.

12. The electronic device of claim 11, wherein the recovering component is a tension spring.

* * * * *